United States Patent

Matsunaga et al.

[11] Patent Number: 5,865,893
[45] Date of Patent: Feb. 2, 1999

[54] SPIN COATING APPARATUS

[75] Inventors: Minobu Matsunaga; Masahiro Mimasaka; Ikuo Mizobata, all of Kyoto, Japan

[73] Assignee: Dainippon Screen Mfg. Co., Ltd., Japan

[21] Appl. No.: 577,827

[22] Filed: Dec. 22, 1995

[30] Foreign Application Priority Data

Dec. 26, 1994 [JP] Japan .................................. 6-323205

[51] Int. Cl.$^6$ .......................... B05A 13/02; B05C 11/02
[52] U.S. Cl. ........................ 118/319; 118/712; 118/52
[58] Field of Search ........................... 118/52, 320, 319, 118/696, 712; 156/356, 378; 427/8, 9

[56] References Cited

U.S. PATENT DOCUMENTS 4,451,507  5/1984  Beltz et al. .............................. 118/52
5,439,519  8/1995  Sago et al. .............................. 118/52

FOREIGN PATENT DOCUMENTS 62-19279   2/1987  Japan .
1135565    8/1989  Japan .

Primary Examiner—David A. Simmons
Assistant Examiner—Calvin Padgett
Attorney, Agent, or Firm—Ostrolenk, Suber, Gerb & Soffen, LLP

[57] ABSTRACT

Uneconomical use of resist liquid is prevented by reducing resist liquid discharging time. Discharging time calculating means calculates a proper resist liquid discharging time, based on a first and a second rotation angular speeds of a supporting pedestal and a discharged flow quantity discharged from resist liquid discharging nozzle per unit time. When the proper resist liquid discharging time has elapsed from the start of discharging of the resist liquid by means of a pump, discharging of the resist liquid is stopped.

7 Claims, 14 Drawing Sheets

SPIN COATING APPARATUS

BACKGROUND OF THE INVENTION

1. Field of the Invention

The present invention is related to a spin coating apparatus such as a spin coater for processing a round substrate such as a semiconductor wafer while supplying predetermined coating liquid on a top surface of the round substrate and rotating the round substrate, and is also related to a spin coating method.

2. Description of the Background Art

As shown in FIG. 13, in a conventional substrate processing apparatus, through a nozzle 2, resist liquid 3 (i.e., photoresist) is supplied as coating liquid onto a central portion of a semiconductor wafer (i.e., round substrate) 1 which is horizontally supported, while rotating the wafer 1 at a low speed of about 900 rpm as shown in FIG. 14. Due to weak centrifugal force which is created by the slow rotation, the resist liquid 3 which stays at the central portion is spread entirely over the wafer 1. At this stage, the resist liquid 3 is spread as two portions, i.e., an approximately round portion 6 which spreads almost uniformly in all directions (hereinafter "core portion") and a portion 7 which outwardly flows in the shape of whiskers (hereinafter "river portion") because of the centrifugal force which becomes locally stronger than surface tension of the core portion, as shown in FIGS. 15 to 17. In FIGS. 15 to 17, the symbol Q expresses a discharged flow quantity per unit time (per second) of the resist liquid 3, and the symbol $\omega$ expresses a rotation angular speed of the wafer during discharging.

Once the core portion 6 of the resist liquid 3 is spread to a certain range, the wafer 1 is rotated at a high speed to further spread the resist liquid 3 using the centrifugal force so that levelling is performed, that is, a film thickness of the resist liquid has a uniform in-plane distribution (i.e., a distribution of the film thickness on the substrate) as shown in FIG. 18. In FIGS. 13, 14 and 18, denoted at 4 is a supporting pedestal which fixes the central portion of the wafer 1 by suction force, denoted at 4a is a rotation shaft which is fixedly attached to the supporting pedestal 4 and driven to rotate by a motor not shown, and denoted at 5 is a drain chamber which is open at an upper portion.

In the conventional technique, conditions such as the discharged flow quantity, an discharging flow time and the rotation angular speed which are necessary to spread the resist liquid 3 all over the top surface of the wafer 1 are set by experiences, rather than based on a logical ground. Hence, in the conventional technique, when the wafer 1 is rotated at a slow speed (about 900 rpm) during discharging of the resist liquid 3, the resist liquid 3 of the core portion 6 spreads slower than the resist liquid 3 of the river portion 7, and therefore, a ratio of consumption of the resist between the core portion 6 and the river portion 7 is about 3:7. This means that the quantity of the resist which flows out without used is 2.3 times as large as the quantity of the resist which coats the top surface of the wafer 1. Thus, since 70% of the resist liquid 3 which is discharged through the nozzle 2 is not used, a large quantity of the resist is consumed, which in turn increases a cost. For instance, when a wafer having a diameter of eight inches is rotated at 900 rpm, assuming that the discharged flow quantity Q per unit time (per second) of the resist liquid 3 is 1 ml/sec, the discharging time t needs be about three to five seconds and a total discharged flow quantity is three to five mililiters.

Further, as the surface area of the core portion 6 is enlarged gradually at a slow rotation speed as in the conventional technique, a solvent evaporates during the spreading, whereby the spreading does not progress smoothly and therefore a processing time becomes even longer.

SUMMARY OF THE INVENTION

The present invention comprises: rotation supporting means which rotates about a vertical shaft while supporting a substrate; coating liquid discharging means which includes a discharging hole of a predetermined radius, the coating liquid discharging means discharging coating liquid onto a central portion of the substrate which is rotated; coating liquid supplying means for supplying the coating liquid to the coating liquid discharging means; coating liquid stopping means for stopping supply of the coating liquid to the coating liquid discharging means; angular speed switching means for switching a rotation angular speed of the rotation supporting means from a first rotation angular speed $\omega$ for discharging of the coating liquid to a second rotation angular speed $\omega_0$ for levelling of the coating liquid after the coating liquid is discharged; discharging time calculating means for calculating a proper coating liquid discharging time t, based on the first rotation angular speed $\omega$, the second rotation angular speed $\omega_0$ and a discharged flow quantity discharged from the coating liquid discharging means per unit time; and stop controlling means for driving the coating liquid stopping means after the proper coating liquid discharging time t has elapsed since the coating liquid supplying means started supplying the coating liquid.

Preferably, the discharging time calculating means includes: rotation angular speed comparing means for comparing the first rotation angular speed $\omega$ with the second rotation angular speed $\omega_0$; a first calculation part for calculating the proper coating liquid discharging time t, using a first arithmetic expression for calculating a time which is necessary for the coating liquid to outwardly flow and reach an edge of the substrate because of rotational centrifugal force which is created by rotation at the first rotation angular speed $\omega$, when the rotation angular speed comparing means determines that the first rotation angular speed $\omega$ is faster than the second rotation angular speed $\omega_0$; and a second calculation part for calculating the proper coating liquid discharging time t, using a second arithmetic expression for calculating a time which is necessary for the coating liquid to outwardly flow and reach an intermediate position of the substrate, which is defined at a predetermined radius on the substrate, because of rotational centrifugal force which is created by rotation at the second rotation angular speed $\omega_0$, when the rotation angular speed comparing means determines that the first rotation angular speed $\omega$ is slower than the second rotation angular speed $\omega_0$.

In the present invention, first of all, based on the first rotation angular speed $\omega$ for discharging of the coating liquid, the second rotation angular speed $\omega_0$ for levelling of the coating liquid and the discharged flow quantity Q from the coating liquid discharging means per unit time, the proper coating liquid discharging time t is calculated (the discharging time calculating step). In this step, the first rotation angular speed $\omega$ and the second rotation angular speed $\omega_0$ are compared with each other (the rotation angular speed comparing step), and when the first rotation angular speed $\omega$ is faster than the second rotation angular speed $\omega_0$, the proper coating liquid discharging time t is calculated using the first arithmetic expression for calculating a time which is necessary for the coating liquid to outwardly flow and reach the edge of the substrate because of rotational centrifugal force which is created by rotation at the first rotation angular speed $\omega$ (the first calculating step). On the other hand, when the first rotation angular speed $\omega$ is slower than the second rotation angular speed $\omega_0$, the proper coating liquid discharging time t is calculated using the second arithmetic expression for calculating a time which is necessary for the coating liquid to outwardly flow and reach the intermediate position of the substrate, which is defined at a predetermined radius on the substrate, because of rotational centrifugal force which is created by rotation at the second rotation angular speed $\omega_0$ (the second calculating step). Following this, the substrate is rotated about the vertical shaft at the first rotation angular speed $\omega$ while supporting the substrate with rotation supporting means, and the coating liquid discharging means which includes the discharging hole of the predetermined radius discharges the coating liquid onto the central portion of the substrate which is rotated only during the proper coating liquid discharging time t (the coating liquid discharging step). Next, the substrate is rotated about the vertical shaft at the second rotation angular speed $\omega_0$ while supporting the substrate with rotation supporting means so that levelling of the coating liquid is achieved, that is, a film of the coating liquid has a uniform in-plane distribution (the coating liquid levelling step). The proper coating liquid discharging time t is calculated in this manner and the coating liquid is then discharged for the proper coating liquid discharging time t, whereby uneconomical use of the coating liquid is prevented and a cost is reduced.

Preferably, the rotation plate having a larger diameter than the substrate is located closely above and parallel to the substrate at least during the proper coating liquid discharging time t, and the rotation plate fixing member for supporting the rotation plate is disposed so that the rotation plate rotates together with the rotation supporting means.

According to the present invention, when the substrate is rotated as mounted on the rotation supporting means, the rotation plate which is fixed by the rotation plate fixing member is rotated together with the substrate. Since this rotates air which is contained in a space between the rotation plate and the substrate, thereby causing the air to move as a so-called rigid body, the substrate is prevented from cutting wind and evaporation of the solvent which is contained in the coating liquid is suppressed. In addition, since the rotation plate and the rotation supporting means form an almost hermetically sealed space, even if the solvent which is contained in the coating liquid evaporates, the air is easily saturated and evaporation of the solvent is suppressed. Therefore, consumption of the coating liquid is reduced.

Further, the rotation angular speed of the substrate during discharging of the coating liquid is preferably at 2,000 r.p.m. or larger.

This reduces an error due to evaporation of the solvent in the respective arithmetic expressions, and makes it possible to relatively accurately calculate the proper coating liquid discharging time. By discharging the coating liquid for the coating liquid discharging time which is calculated in such a manner, the quantity of the coating liquid which is necessary to spread the coating liquid over the entire substrate is set to a minimum quantity. As a result, consumption of the coating liquid is reduced.

Accordingly, it is an object of the present invention to offer a spin coating apparatus and a spin coating method in which a processing time is shortened and less quantity of coating liquid is consumed.

These and other objects, features, aspects and advantages of the present invention will become more apparent from the following detailed description of the present invention when taken in conjunction with the accompanying drawings.

DESCRIPTION OF THE PREFERRED EMBODIMENTS

In a spin coating apparatus according to a preferred embodiment of the present invention, for economical use of a resist, optimum conditions regarding various relationships between a resist viscosity, the number of rotations for coating, a discharged flow quantity, an discharging time, a discharged configuration and an discharging position (nozzle diameter, nozzle height) are extracted, so as to reduce the quantity of a used resist based on theoretical formulas which apply to an initial stage of coating of a resist, and resist coating is then performed under an extracted condition.

<Structure>

Figure 1:
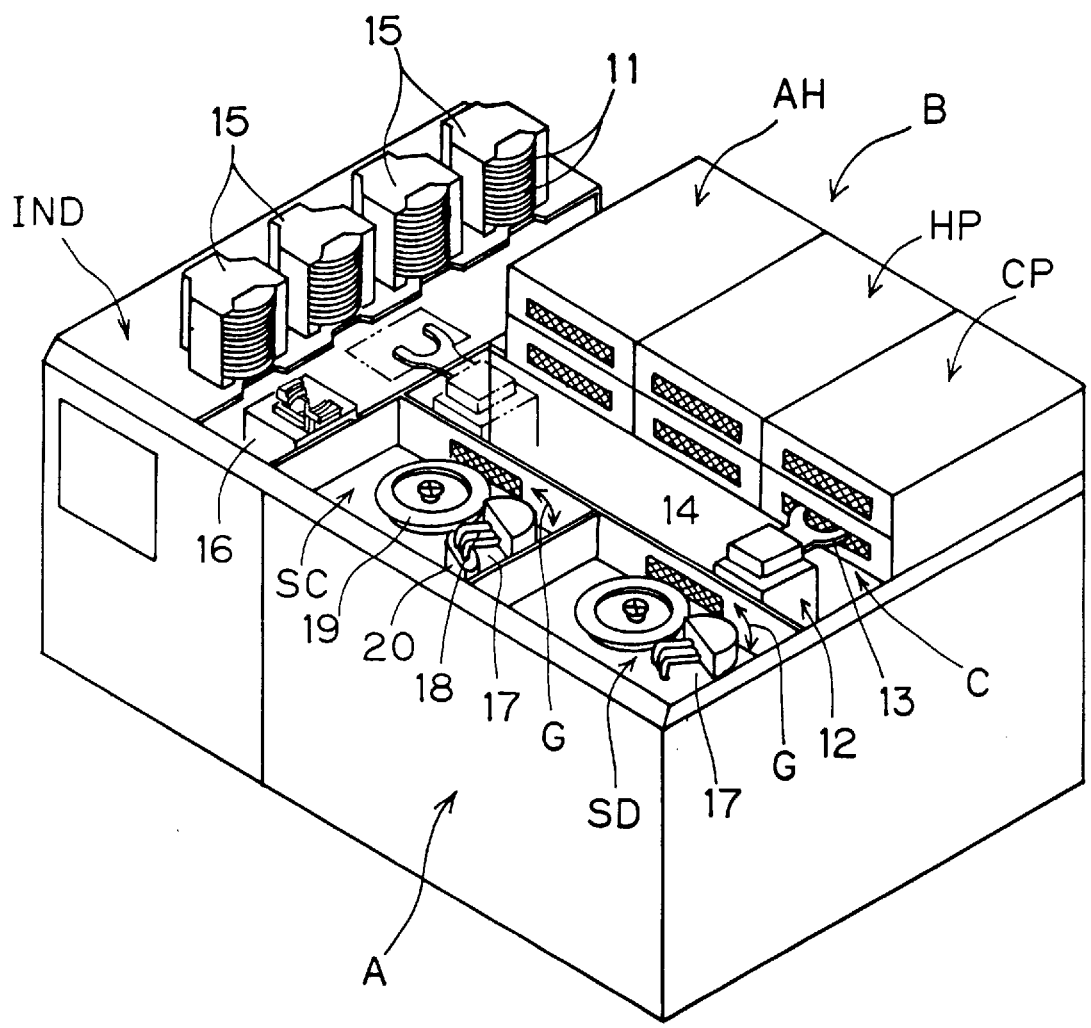
FIG. 1 is a perspective view showing an overall appearance of a substrate processing apparatus which includes a spin coating apparatus according to a preferred embodiment of the present invention.

FIG. 1 is a perspective view showing an overall appearance of a substrate processing apparatus which includes a spin coating apparatus according to a preferred embodiment of the present invention. The same reference signs are assigned to elements which perform similar functions to those in the conventional technique. In the substrate processing apparatus according to this preferred embodiment, the entire mechanical structure shown in FIG. 1 is disposed within a dust-proof room which is controlled so that cleanliness does not exceed a predetermined level. That is, this is an apparatus for performing a series of processing (e.g., coating, developing, adhesion promotion, heating, cooling) on a wafer (semiconductor substrate) 11. In the apparatus, a spin coater SC which serves as a substrate processing part for coating and a spin developer SD which serves as a substrate processing part for developing are arranged in the front side to form a substrate processing array A.

Further, at a position of the back side facing the substrate processing array A, an adhesion promotion unit AH, a hot plate HP and a cleaning plate CP each serving as a substrate processing part for performing various types of thermal treatments are arranged in a three-dimensional arrangement to form a substrate processing zone B.

Still further, this apparatus includes a transportation zone C which extends along the substrate processing array A, between the substrate processing array A and the substrate processing zone B. In the transportation zone C, a transportation robot 12 is arranged so as to be freely movable. The transportation robot 12 comprises a movable element 14 which includes a supporting member 13 which consists of a pair of arms for supporting the wafer 11. The upper and lower arms of the arm pair forming the supporting member 13, when driven by an arm drive mechanism (not shown), independently move toward and retract from the substrate processing array A side and the substrate processing zone B side, respectively. One arm receives a processed substrate from one of the processing parts of the substrate processing array A and the substrate processing zone B, while the other arm loads other substrate from a previous substrate processing part or the like, whereby the wafers 11 are exchanged at the processing part above.

Although not shown in FIG. 1, a three-dimensional drive mechanism is linked to the movable element 14 of the transport robot 12. The movable element 14 is moved to the respective substrate processing parts by controlling the drive mechanism, and the wafers 11 are loaded and unloaded. In FIG. 1, denoted at 17 is a nozzle mechanism (coating liquid discharging means) which includes three resist liquid discharging nozzles 18 (2) and discharges the resist liquid onto the wafers 11. The nozzle mechanism 17 is driven and controlled by a drive apparatus not shown so as to be freely movable in a vertical direction and freely rotatable in the direction of an arrow G in FIG. 1.

An indexer IND is installed on one end side where the substrate processing row A, the substrate processing zone B and the transportation zone C terminate (i.e., left-hand side in FIG. 1) to retrieve the wafers 11 from a cassette 15 and return the wafers 11 to the cassette 15. A transfer robot 16 disposed to the indexer IND retrieves the wafers 11 from the cassette 15 and transfers the retrieved wafers 11 to the transport robot 12, or conversely receives the already processed wafers 11 from the transport robot 12 and returns the wafers 11 back into the cassette 15. Although not shown in FIG. 1, an interface buffer (IF-B) is disposed at a position where the substrate processing row A, the substrate processing zone B and the transportation zone C terminate at the opposite end (i.e., right-hand side in FIG. 1) to unload and load the wafers 11 from and into other substrate processing apparatus. Loading/unloading of the wafers 11 is realized by a concerted operation of the transfer robot of the interface unit and the transport robot 12. In FIG. 1, denoted at 19 is a drain cup. On the side of the drain cup 19, a waiting pot 20 is disposed which contains the resist liquid or a predetermined solvent which is included in the resist liquid.

Figure 2:
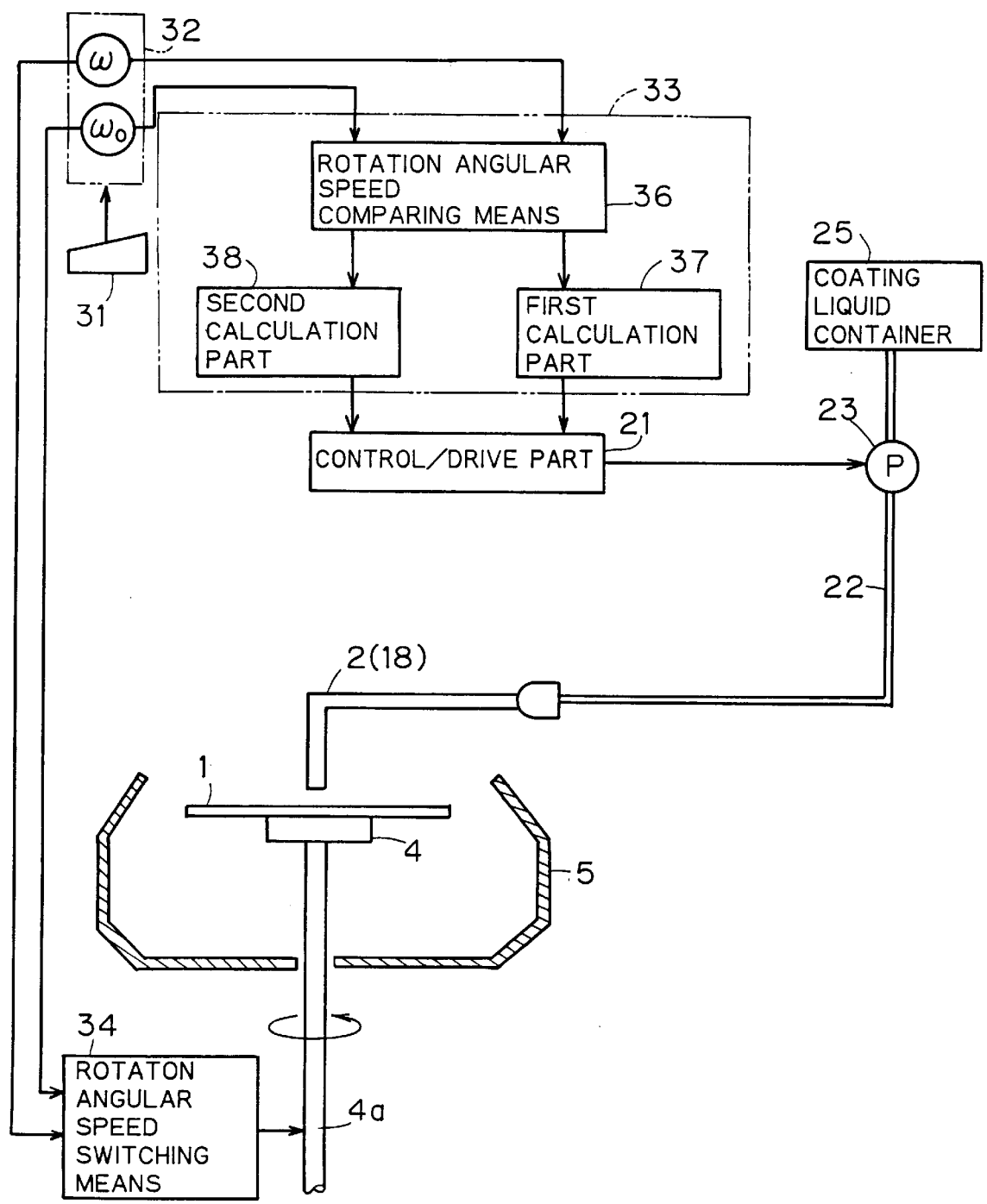
FIG. 2 is a block diagram showing an outline of the spin coating apparatus according to the preferred embodiment of the present invention.
Figure 13:
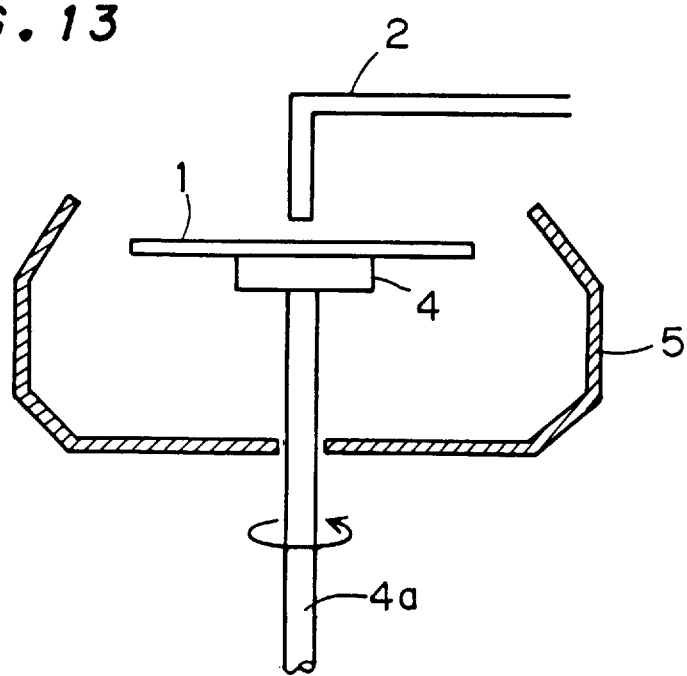
FIG. 13 is a cross sectional view showing an outline of a conventional spin coating apparatus.
Figure 14:
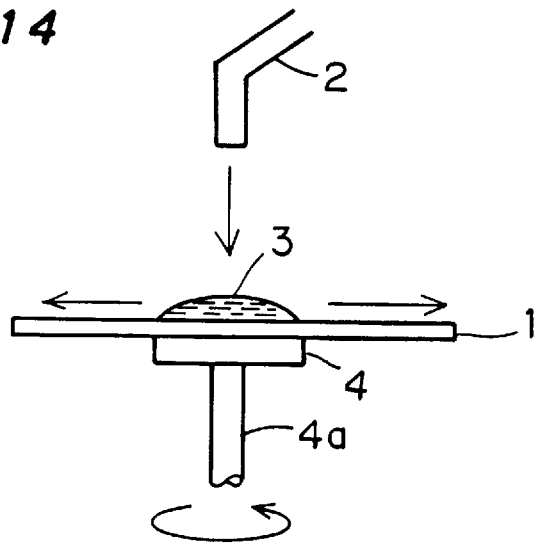
FIG. 14 is a side view showing an operation of discharging resist liquid in the conventional spin coating apparatus.

As shown in FIG. 2, in the spin coating apparatus according to the preferred embodiment, while rotating a semiconductor wafer (round substrate) 1 which is horizontally held at a predetermined rotation angular speed about the rotation shaft 4a, the resist liquid, i.e., coating liquid, is discharged onto a central portion of the wafer 1 from the nozzle 2 (resist liquid discharging means: 18), thereby spreading the resist liquid 3 which stays at the central portion entirely over the wafer 1 utilizing weak centrifugal force which is created by the slow speed rotation. Following this, the wafer 1 is rotated at a high speed to level out the resist liquid 3 by the centrifugal force, that is, so that the film thickness of the resist liquid has a uniform in-plane distribution. In the spin coating apparatus according to the preferred embodiment, the structure which is formed by the nozzle 2, the supporting pedestal 4, the rotation shaft 4a and the drain chamber 5 is similar to that shown in FIG. 13, and therefore, a redundant description will be omitted.

As shown in FIG. 2, when the resist liquid is discharged from the nozzle 2, under the control of a control/drive part 21 in accordance with processing conditions for a specified substrate processing sequence, a pump 23 which is mounted in a coating liquid supply pipe 22 is driven so that the resist liquid is discharged from the nozzle 2 toward the wafer 1. In FIG. 2, denoted at 25 is a coating liquid container for containing the resist liquid. The pump 23 and the coating liquid container 25 form coating liquid supplying means. Although the coating liquid supply pipe 22 includes a filter for removing particles, a manifold for adjusting a flow path, etc., in reality, FIG. 2 omits these elements for clarity.

The spin coating apparatus according to the preferred embodiment comprises an input panel 31 for inputting rotation angular speeds ω and $ω_0$ of the supporting pedestal 4 during resist discharging and levelling, respectively, the discharged flow quantity Q of the resist liquid per unit time, etc., memory means 32 for storing the rotation angular speeds ω and $ω_0$, discharging time calculating means 33 for calculating a proper value of the resist liquid discharging time t for the nozzle 2 based on the rotation angular speeds ω and $ω_0$, the resist liquid discharged flow quantity Q per unit time, etc., and for thereafter outputting the proper value to the control/drive part 21, and angular speed switching means 34 for changing the rotation angular speed of the supporting pedestal 4 from the first rotation angular speed ω for discharging of the resist liquid to the second rotation angular speed $ω_0$ for levelling of the resist liquid after discharging of the resist liquid, as shown in FIG. 2.

The discharging time calculating means 33 comprises rotation angular speed comparing means 36 for comparing the first rotation angular speed ω with the second rotation angular speed $ω_0$, a first calculation part 37 for calculating a proper resist liquid discharging time, using a first arithmetic expression (i.e., Formula 21 described later) which yields a time t which is necessary for the resist liquid to outwardly flow and reach the periphery of the wafer 1 due to centrifugal force which is created by rotation at the speed ω when the rotation angular speed comparing means 36 determines that a relationship $ω \geq ω_0$ holds, and a second calculation part 38 for calculating a proper resist liquid discharging time, using a second arithmetic expression (i.e., Formula 22 described later) which yields a time which is necessary for the resist liquid to outwardly flow and reach an intermediate position which is defined by "Radius r of Wafer $1 \times 2/3$" when the rotation angular speed comparing means 36 determines that a relationship $ω < ω_0$ holds.

The control/drive part 21 functions as stop controlling means which stops the pump 23 when the proper resist liquid discharging time t has elapsed from the start of supplying of the resist liquid by the pump 23.

<Idea on Resist Liquid Discharging Time t>

Now, a description will be given on an idea regarding the proper resist liquid discharging time t which is calculated by the discharging time calculating means 33. Basically, theoretical formulas which apply to an initial stage of coating of a resist are determined regarding relationships between a resist viscosity, a rotation angular speed during coating, a discharged flow quantity, an discharging time, a discharged configuration and an discharging position (nozzle diameter, nozzle height), and an optimum condition to reduce the quantity of a used resist is extracted based on the theoretical formulas. Since evaporation of a resist solvent is suppressed by reducing the discharging time in the present embodiment, a quantity of an evaporated resist solvent during the initial stage of coating is not regarded as a parameter.

Figure 3:
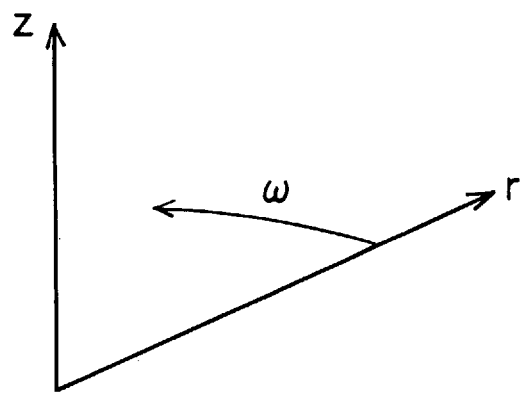
FIG. 3 is a view of a cylindrical coordinate system within the spin coating apparatus according to the preferred embodiment of the present invention.
Figure 4:
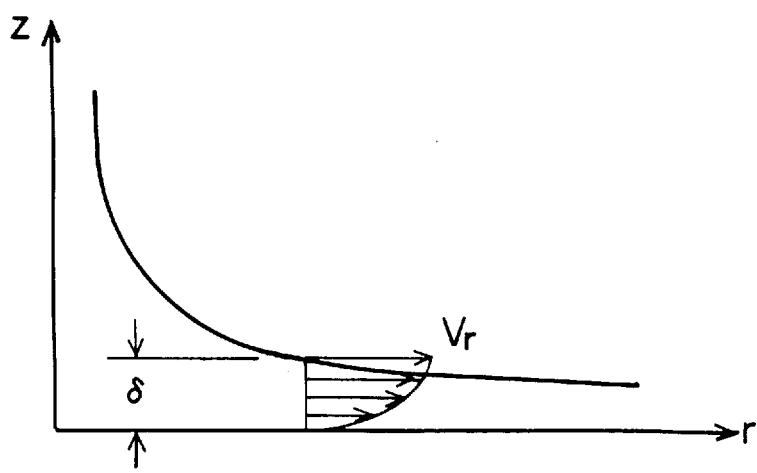
FIG. 4 is a view showing a thickness 6 with an optional radius r in the cylindrical coordinate system within the spin coating apparatus according to the preferred embodiment of the present invention.

Considering a coating model in which the liquid is supplied from the center of an axially symmetrical infinite disk which rotates at the angular speed ω in a cylindrical coordinate system shown in FIGS. 3 and 4, the following arithmetic expression (Formula 9) is obtained because of balance in shearing force based on centrifugal force with an optional radius r and a gradient of an axial direction speed.

$$-\mu \frac{\partial^2 V_r}{\partial z^2} = \rho r \omega^2 \tag{9}$$

In Formula 9, a variant $\mu$ is a viscosity coefficient of the resist liquid, a variant ρ is a density, and a variant ω is a rotation angular speed of the wafer during discharging of the resist liquid (See FIG. 3). A boundary condition is as follows (Formula 10):

$$V_r = 0 \text{ at } z=0$$
$$\partial V_r/\partial z = 0 \text{ at } z=\delta \tag{10}$$

From Formula 10, a radius direction speed $V_r$ with the optional radius r and an axial direction height z (See FIG. 4) is defined by the following arithmetic expression (Formula 11):

$$V_r = \frac{1}{\mu}\left(-\frac{1}{2}\rho\omega^2 r z^2 + \rho\omega^2 r \delta z\right) \tag{11}$$
$$= \frac{r\omega^2 \delta^2}{\nu}\left[\frac{z}{\delta} - \frac{1}{2}\left(\frac{z^2}{\delta^2}\right)\right]$$

In Formula 11, the symbol ν indicates a coefficient of kinematic viscosity. The coefficient ν is a variant which is equal to $(\mu/\rho)$. From Formula 11, an average radius direction speed $V_{rAV}$ with the optional radius r and the discharged flow quantity Q discharged from the nozzle per unit time are defined by Formula 12 and Formula 13, respectively.

$$V_{rAV} = \frac{Q}{A_{z-r}} = \int_0^\delta 2\pi r V_r dz / \int_0^\delta 2\pi r dz \tag{12}$$
$$= \frac{1}{3}\left(\frac{r\omega^2 \delta^2}{\nu}\right)$$

$$Q = 2\pi r \delta V_{rAV} = \frac{2\pi}{3}\left(\frac{r^2 \omega^2 \delta^3}{\nu}\right) \tag{13}$$

From Formula 13, a film thickness δ with the optional radius r (See FIG. 4) is defined by the following arithmetic expression (Formula 14):

$$\delta = \left[\frac{3}{2}\pi\left(\frac{Q\nu}{r^2\omega^2}\right)\right]^{1/3} \tag{14}$$

Now, assuming that an outer diameter of the rotating disk is R, an average film thickness $\delta_{AV}$ is defined by the following arithmetic expression (Formula 15):

$$\delta_{AV} = \frac{V}{A} = \int_0^R 2\pi r \delta \cdot dz/\pi R^2 \tag{15}$$
$$= \left(\frac{81 Q\nu}{16\pi}\right)^{1/3} / (\omega R)^{2/3}$$

Figure 5:
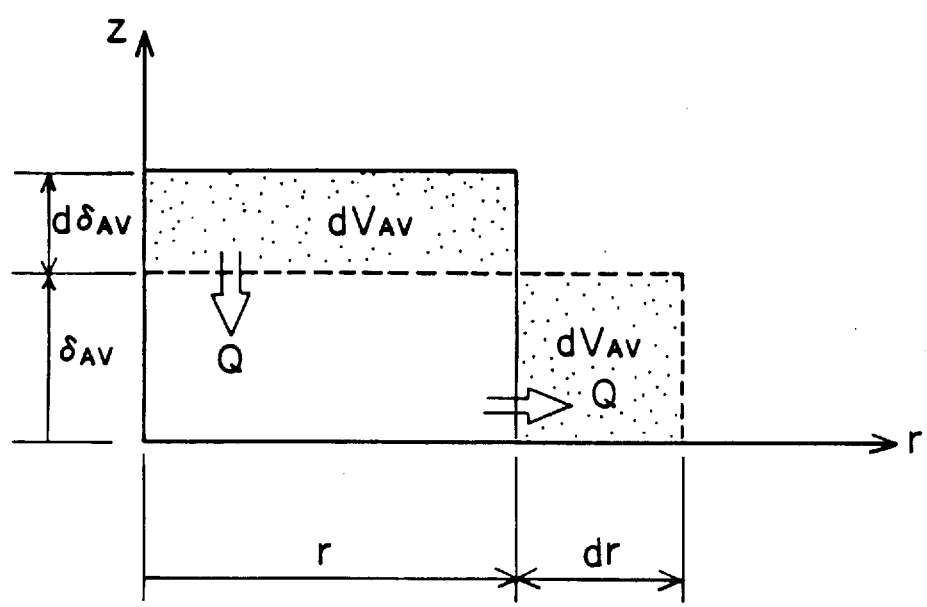
FIG. 5 is a view showing a change in the thickness with time within the spin coating apparatus according to the preferred embodiment of the present invention.

Now, based on these formulas, a change in the film thickness with time will be discussed using a model which is shown in FIG. 5. Now, assuming that a quantity of the liquid on the disk at a certain time t is V, a time-sequence change dV/dt in the quantity of the liquid is defined by the following arithmetic expression (Formula 16):

$$\frac{dV_{AV}}{dt} = Q = -\pi r^2 \frac{d\delta_{AV}}{dt} \quad (16)$$

Hence, from Formula 16, $$\frac{d\delta_{AV}}{dt} = -\frac{16}{81}\left(\frac{\omega^2 \delta_{AV}^3}{\nu}\right) = -\frac{Q}{\pi r^2} \quad (17)$$

$$\frac{1}{\delta_{AV}^2} - \frac{1}{\delta_{AV0}^2} = 0.395 \frac{\omega^2 t}{\nu}$$

In Formula 17, the symbol $\delta_{AV0}$ indicates an initial average film thickness at a time t=0. Therefore, a time-sequence change in the film thickness $\delta$ is defined by the following arithmetic expression (Formula 18):

$$\delta_{AV} = \frac{\delta_{AV0}}{\sqrt{(1 + 0.395\omega^2 \delta_{AV0}^2 t/\nu)}} \quad (18)$$

Calculating a radius r of spread liquid at the optional time t from the relationship $Q=2\pi r\delta_{AV}\cdot dr/dt$ in FIG. 5, the following arithmetic expression (Formula 19) is obtained:

$$\int_{r0}^{r} r\,dr = Q \int_{0}^{t} \frac{(1 + 0.395\omega^2 \delta_{AV0}^2 t/\nu)^{1/2}}{2\pi\delta_{AV0}}\,dt \quad (19)$$

$$r = \left[\frac{\{2\nu Q (1 + 0.395\omega^2 \delta_{AV0}^2 t/\nu)^{3/2} - 1\}}{1.185\pi\omega^2 \delta_{AV0}^3} + r_0^2\right]^{1/2}$$

Rewiring Formula 19 in terms of the time t, the following arithmetic expression (Formula 20) is obtained:

$$t = \frac{\nu}{0.395\omega^2\delta_0^2}\left\{\left(1 + \frac{1.185\pi\omega^2\delta_0^3(r^2 - r_0^2)}{2\nu Q}\right)^{2/3} - 1\right\} \quad (20)$$

In Formula 20, the symbol $\delta_0$ indicates an initial film thickness at a time t=0, and the symbol $r_0$ indicates an initial radius at the time t=0. The initial film thickness $\delta_0$ is approximated by a height of the discharging nozzle which is measured from a substrate surface while the initial radius $r_0$ is approximated by a radius of the discharging nozzle.

Figure 6:
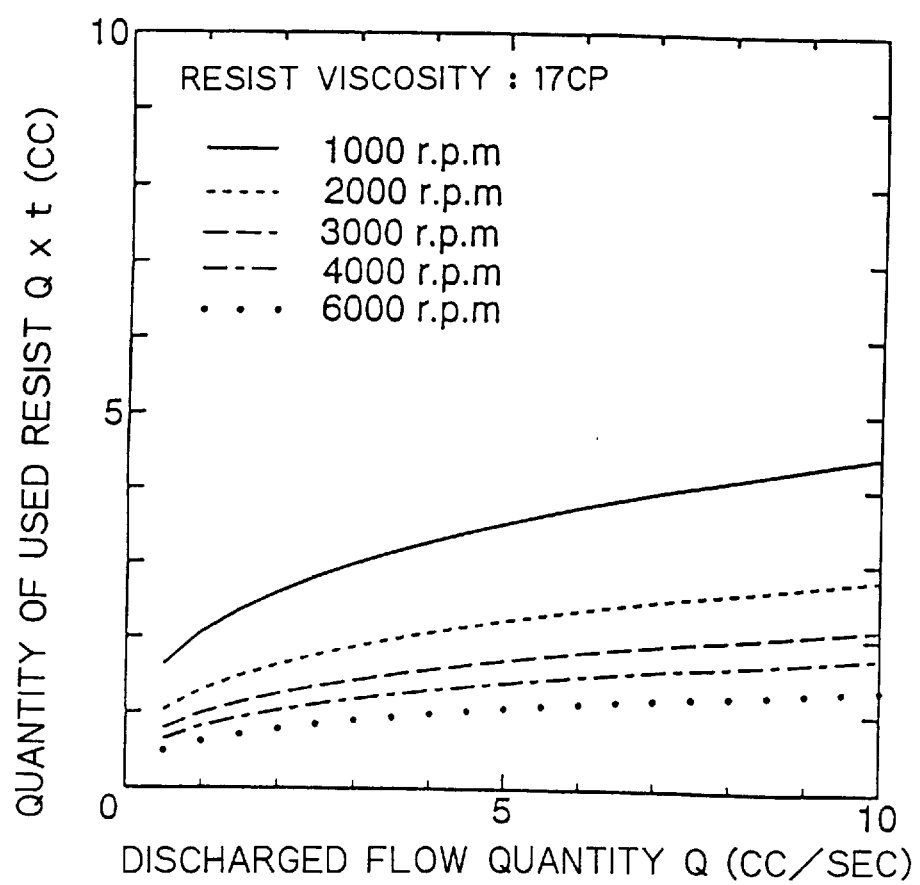
FIGS. 6 and 7 are views showing a relationship between a discharged flow quantity and a quantity of a used resist in the spin coating apparatus according to the preferred embodiment of the present invention, using a resist viscosity as a parameter.

Next, an influence of the rotation angular speed upon initial spreading will be described. FIG. 6 shows a relationship between the discharged flow quantity Q and a used quantity V=Qt of the resist liquid which are calculated from Formulas 19 and 20, based on the time t from the start of discharging of the resist liquid until the resist spreads to the edge of the wafer, where the size of the wafer is eight inches, the discharging position is at the center of the wafer and a height of five mm from the surface of the wafer, an inner diameter of a discharging pipe is three mm and the resist viscosity is 17 CP (constant). In FIG. 6, the rotation angular speed $\omega$ for discharging of the resist is used as a parameter. FIG. 6 shows that the used quantity (Q×t) becomes smaller as the rotation angular speed $\omega$ for discharging of the resist is larger and the discharged flow quantity Q is smaller.

As the rotation angular speed $\omega$ becomes even faster, the discharged flow quantity Q exerts less influence upon the used quantity (Q×t) of the resist, and the used quantity becomes more constant.

Figure 7:
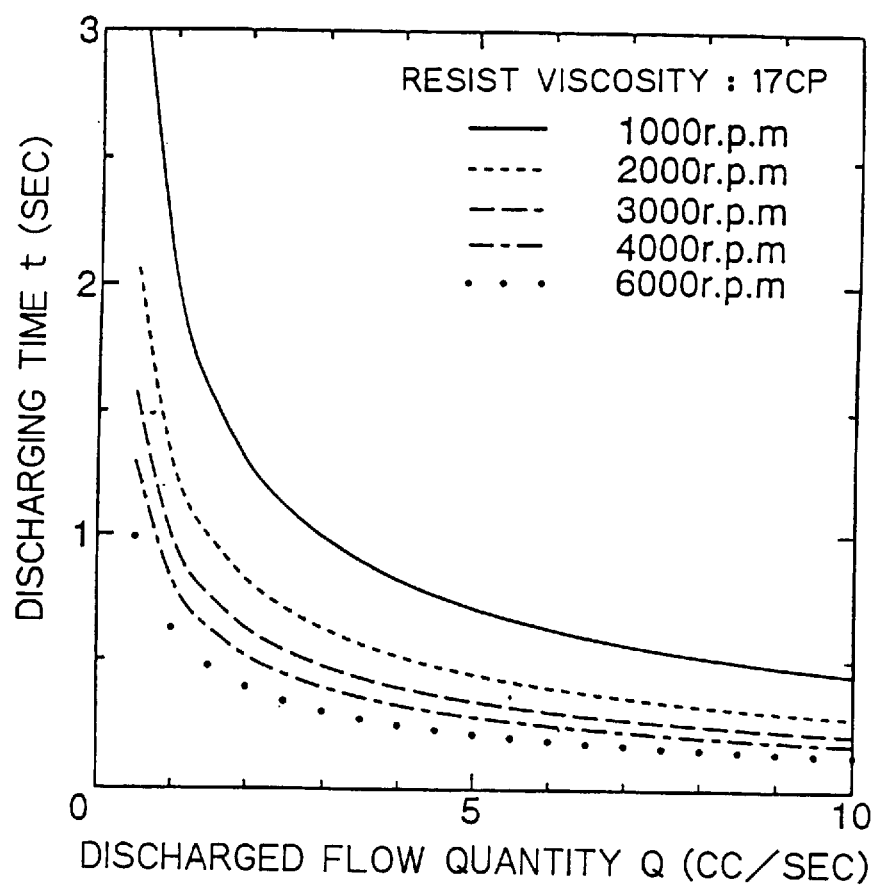

FIG. 7 shows a relationship between a reaching time which is necessary for the resist liquid to reach the edge of the wafer (This time is equal to the resist liquid discharging time t.), which is measured along a vertical axis, and the discharged flow quantity Q. As the rotation angular speed $\omega$ is faster and as the discharged flow quantity Q is larger, the reaching time t is shorter.

Further, as the rotation angular speed $\omega$ is faster, a ratio of change in both the discharging time t and the used quantity (Q×t) of the resist because of the discharged flow quantity Q is smaller.

Figure 8:
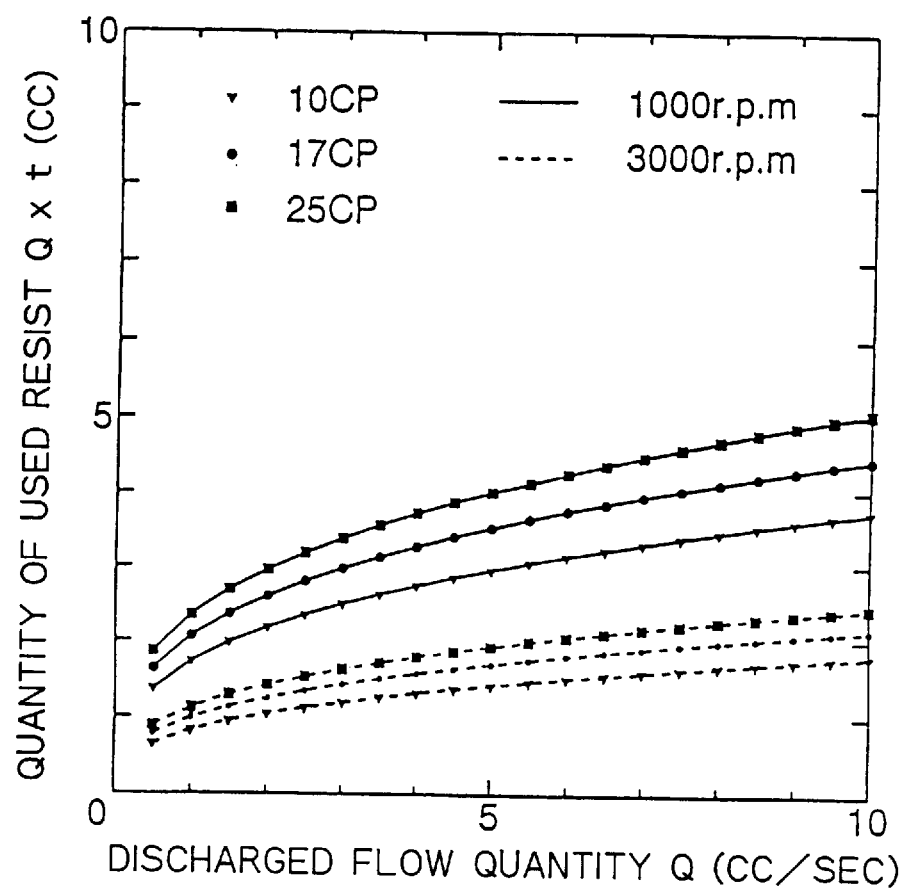
FIGS. 8 and 9 are views showing a relationship between a discharged flow quantity and an discharging time in the spin coating apparatus according to the preferred embodiment of the present invention, using a rotation angular speed of a wafer as a parameter.

Next, an influence of the resist viscosity upon initial spreading will be described. FIG. 8 shows relationships between the used quantity (Q×t) and the discharged flow quantity Q in two cases where the rotation angular speed is 1,000 r.p.m. and 3,000 r.p.m., using the resist viscosity (10 CP, 17 CP, 25 CP) as a parameter.

From FIG. 8, it is understood that the used quantity (Q×t) of the resist with respect to the discharged flow quantity Q is smaller as the resist viscosity is smaller. As the rotation angular speed $\omega$ is faster and as the discharged flow quantity Q is smaller, the viscosity exerts less influence upon the used quantity (Q×t) of the resist.

Figure 9:
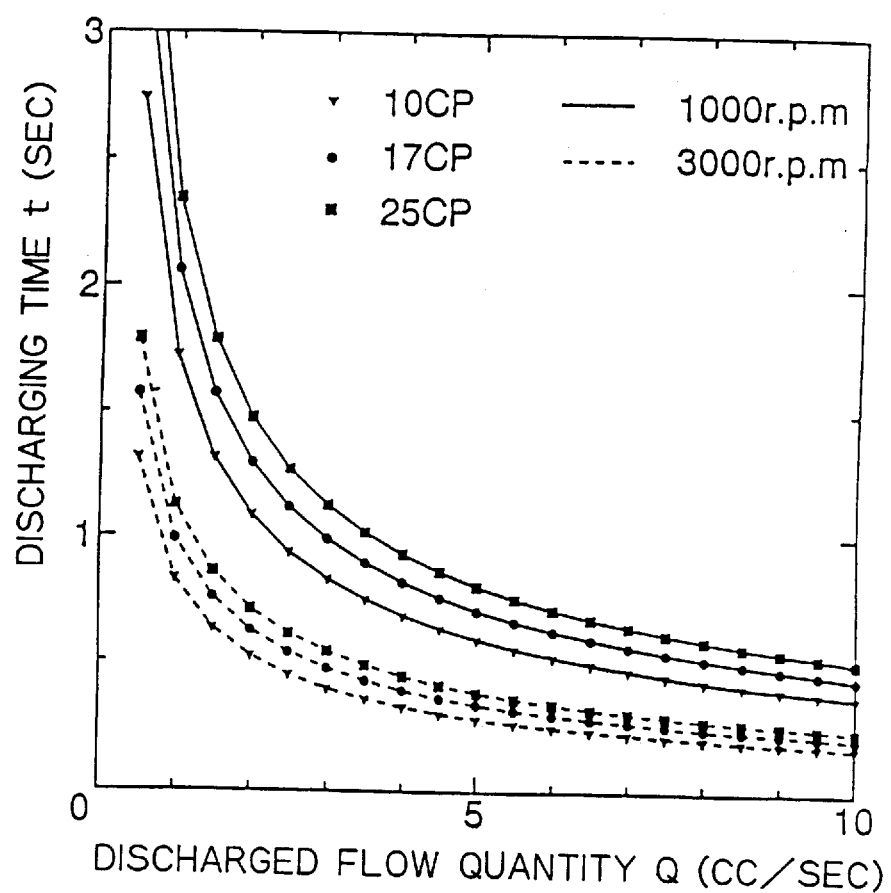

FIG. 9 shows an influence of the resist viscosity (10 CP, 17 CP, 25 CP) upon the discharging time t. As the viscosity is larger, the discharging time t is longer.

Figure 10:
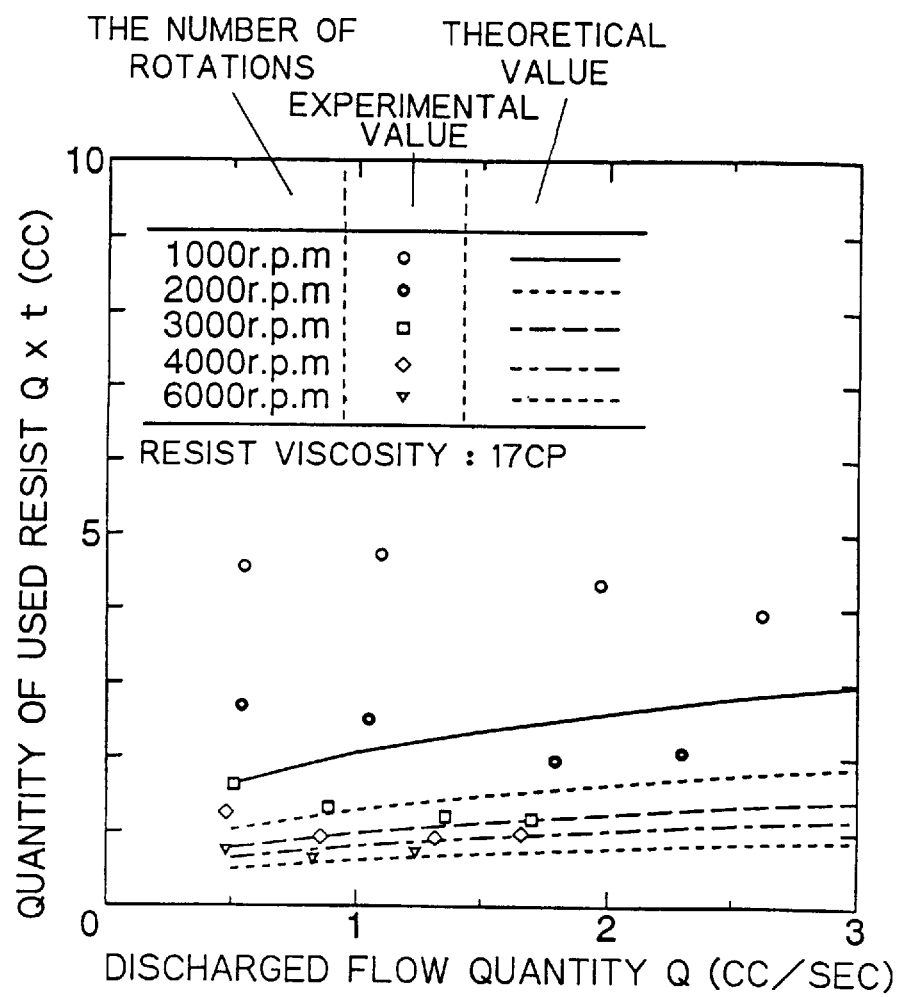
FIGS. 10 and 11 are views showing a result of comparison between experimental values and theoretical values regarding the relationship between the discharged flow quantity and the discharging time in the spin coating apparatus according to the preferred embodiment of the present invention, using a rotation angular speed of a wafer as a parameter.
Figure 11:
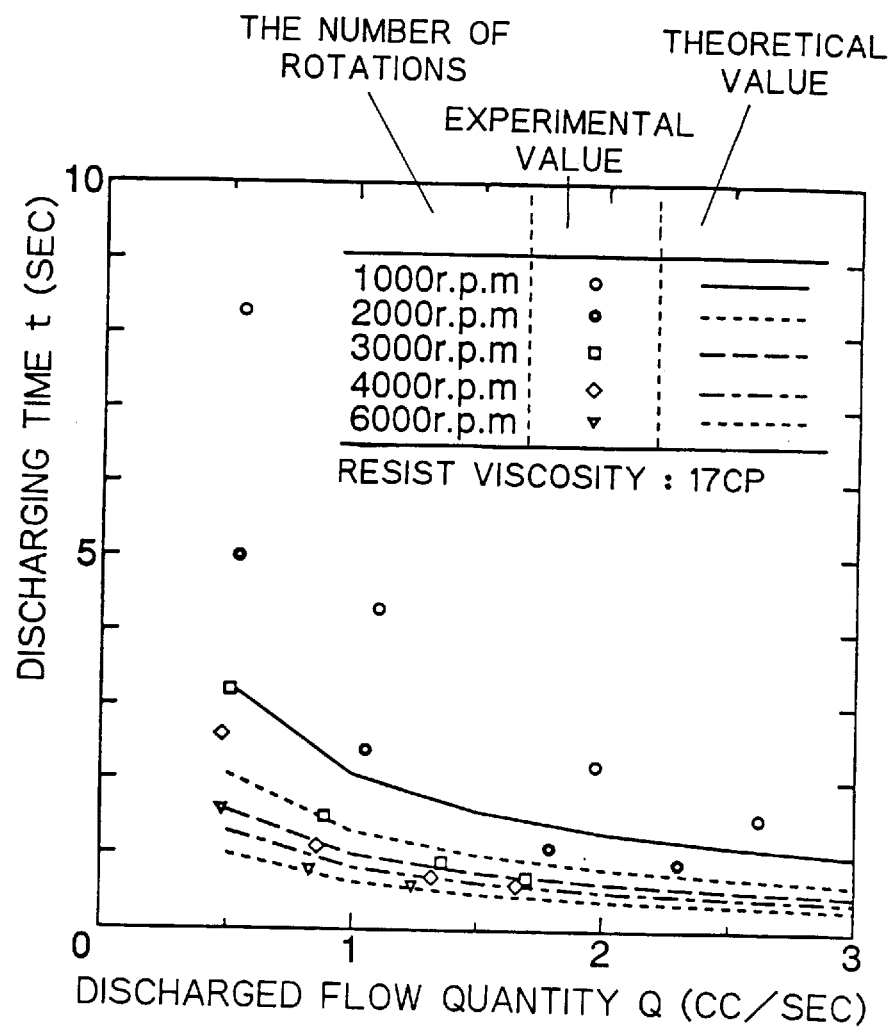

FIG. 10 shows comparison of between experimental values and theoretical values regarding the relationship between the used quantity (Q×t) of the resist and the discharged flow quantity Q. In any case, from FIG. 11, the discharging time t as it is when the experimental values agree extremely well with the theoretical values is not longer than one second.

From the above, if the rotation angular speed $\omega$ is set at 2,000 r.p.m. or larger to reduce the quantity of an evaporated resist solvent, the discharging time t is set at one second or shorter.

Now, since Formula 20 is a theoretical arithmetic expression which is yielded considering average values such as the average radius direction speed $V_{rAV}$ and the average film thickness $\delta_{AV}$, the speed and the film thickness do not stay constant in real processing. Hence, to perform processing without fail, it is necessary to discharge the resist considering predetermined safety. To be more specific, the discharging time t calculated by Formula 20 is multiplied with a safety coefficient $\alpha_{S1}$ as in Formula 21. The safety coefficient $\alpha_{S1}$ is preferably about "1.3" specifically.

$$t \leq \frac{\alpha_{S1}\nu}{0.395\delta_0^2\omega^2}\left\{\left(1 + \frac{1.185\pi\delta_0^3\omega^2(r^2 - r_0^2)}{2\nu Q}\right)^{2/3} - 1\right\} \quad (21)$$

Figure 15:
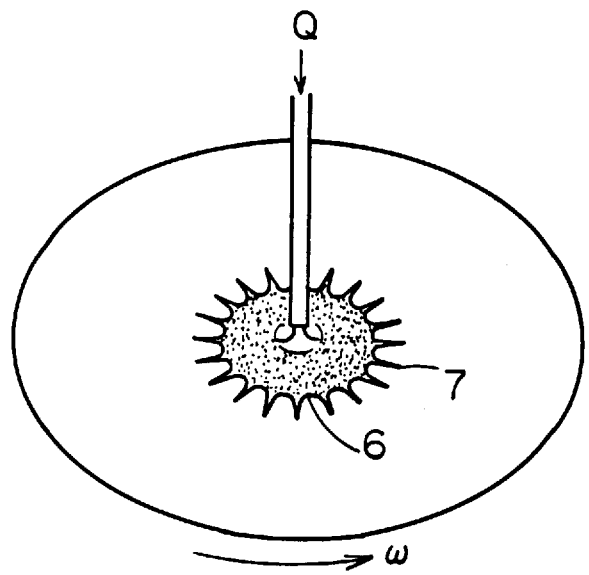
FIGS. 15 to 17 are perspective views showing the operation of discharging resist liquid in the conventional spin coating apparatus.
Figure 16:
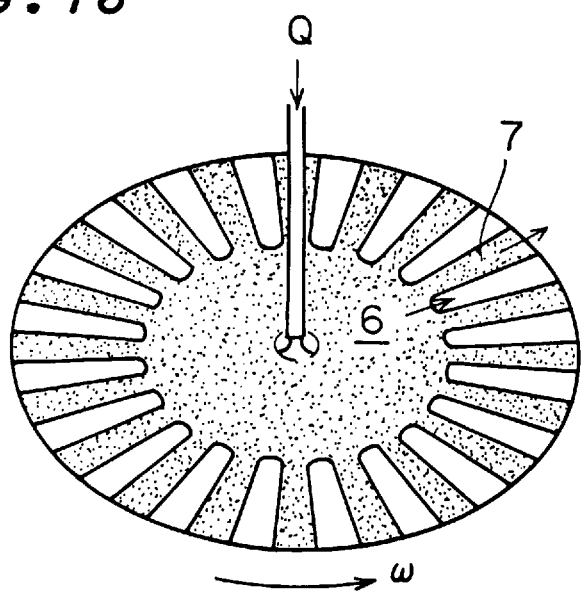
Figure 17:
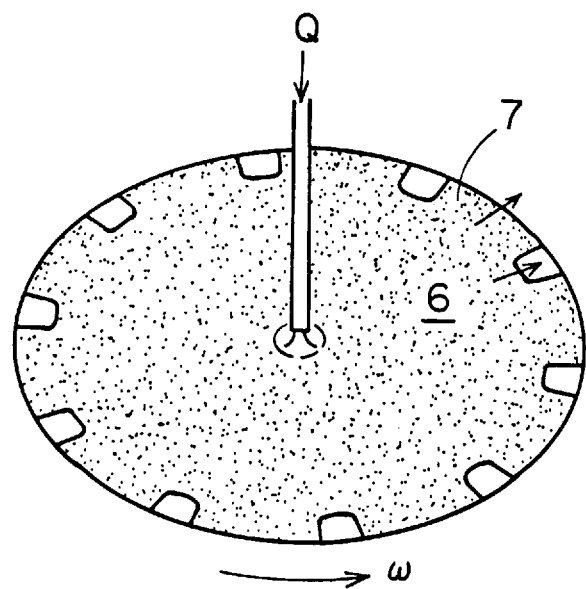
Figure 18:
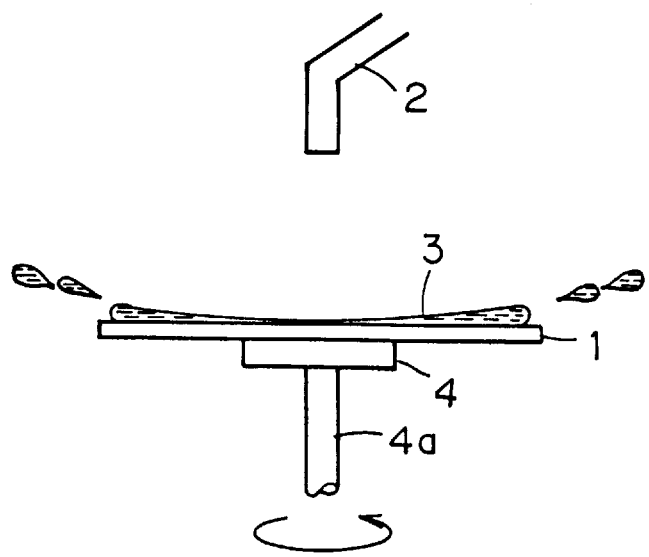
FIG. 18 is a side view showing a levelling operation in the conventional spin coating apparatus.

Formula 21 is a theoretical arithmetic expression (first arithmetic expression) for calculating a time which is necessary for the resist liquid to outwardly flow and reach the edge of the wafer 1 because of centrifugal force which is created by rotation at the first rotation angular speed $\omega$. Formula 21 assumes a case where the resist is discharged without changing the rotation angular speed $\omega$ until the core portion 6 (See FIG. 15) of the resist liquid reaches the edge of the wafer 1. Hence, when the rotation angular speed $\omega$ for discharging is not smaller than the rotation angular speed $\omega_0$ for subsequent processing such as levelling (i.e., $\omega \geq \omega_0$), if the resist liquid is not likely to spread during the subsequent processing or in other occasions, the resist may be discharged for the discharging time t which is yielded by Formula 21.

On the other hand, when the rotation angular speed ω for discharging is smaller than the rotation angular speed $ω_0$ for subsequent processing such as levelling (i.e., $ω<ω_0$), a processing efficiency is better if spreading is limited to a certain extent during discharging and the resist liquid is then spread over the remaining radius after discharging, rather than trying to spread the whole amount of the resist liquid during discharging. Here, a premise is that a periphery of the core portion 6 of the resist liquid starts moving from the central portion of the wafer 1 whose radius is r and flows outwardly to a position which is away from the ceneral portion over a distance r×⅔ (hereinafter "intermediate position") within the discharging time t and the periphery of the core portion 6 thereafter reaches the edge of the wafer 1 as a result of levelling. Considering this, a weighted mean of the rotation angular speed ω for discharging and the rotation angular speed $ω_0$ for levelling is approximately considered. Further, the discharging time t must be the same as defined by Formula 21 when $ω=ω_0$. For this reason, when $ω<ω_0$, a proper discharging time t is calculated by the following arithmetic expression (Formula 22) which is obtained by modifying Formula 21 above:

$$t \leq \frac{\alpha_{S1}v}{0.395\delta_0^2\omega^2}\left[\left\{1+\frac{1.185\pi\delta_0^3\omega^2\left(r^2\left(\frac{(\alpha_{S2}-1)\omega+\omega_0}{\alpha_{S2}\omega_0}\right)^2-r_0^2\right)}{2vQ}\right\}^{2/3}-1\right] \quad (22)$$

In the present embodiment, evaporation of the resist liquid is not considered as described above. However, as well known in the art, a resist is characterized in that a solvent contained therein progressively evaporates with time to thereby increase the viscosity of the resist accordingly. Hence, although a disagreement between the experimental values and the theoretical values becomes larger as the discharging time t is longer, as can be understood from the results of the experiment described above, since a change in the resist viscosity is ignored for one second from the start of discharging, the experimental values approximately coincide with the theoretical values.

<Operation>

An operation of the spin coating apparatus having such a structure above and an operation in the spin coating method will be described. First, the first rotation angular speed ω, the second rotation angular speed $ω_0$ and the discharged flow quantity Q discharged from the resist liquid discharging means per unit time are inputted on the input panel 31 and stored in the memory means 32. At this stage, the discharging time calculating means 33 calculates a proper resist liquid discharging time t based on the two rotation angular speeds ω and $ω_0$ and the discharged flow quantity Q (discharging time calculating step). That is, first of all, the rotation angular speed comparing means 36 compares the first rotation angular speed ω with the second rotation angular speed $ω_0$ (rotation angular speed comparing step). When determined as $ω \geq ω_0$, a proper coating liquid discharging time t is calculated using Formula 21 (first calculating step). Conversely, if determined as $ω<ω_0$, a proper coating liquid discharging time t is calculated using Formula 22 (second calculating step).

During discharging of the resist liquid, the angular speed switching means 34 sets the supporting pedestal 4 to rotate at the first rotation angular speed ω, and the wafer 1 is rotated about a vertical axis. The control/drive part 21 then drives the pump 23, whereby the resist liquid is supplied from the coating liquid container 25 onto a top central portion of the wafer 1 through the coating liquid supply pipe 22 and the nozzle 2 (resist liquid discharging step).

After performing such an operation continuously for the proper resist liquid discharging time t which is calculated by the discharging time calculating means 33, the control/drive part 21 (stop controlling means) switches the pump 23 into a stop state. At this stage, the core portion 6 of the resist liquid must have reached the edge of the wafer 1 when $ω \geq ω_0$. Conversely, when determined as $ω<ω_0$, the core portion 6 of the resist liquid must have reached the intermediate position which is away from the center over a distance r×⅔ on the wafer 1 after outwardly flowing at this stage.

Following this, the angular speed switching means 34 changes the rotation angular speed of the supporting pedestal 4 from the first rotation angular speed a) to the second rotation angular speed $ω_0$, and levelling using centrifugal force is performed for about thirty seconds (resist liquid levelling step) to thereby obtain a generally uniform film thickness. The wafer 1 may be then cleaned at the back surface and the edge surface.

Thus, if the rotation angular speed ω is set at 2,000 r.p.m. or faster during discharging of the resist liquid, an error in Formula 21 or Formula 22 as a theoretical arithmetic expression attributed to evaporation of the solvent is reduced, and therefore, the resist liquid discharging time t which is needed at least to satisfy Formula 21 or Formula 22 is calculated relatively accurately. When the resist liquid is discharged for the resist liquid discharging time t which is calculated in such a manner, the resist liquid is spread over the entire wafer 1 using a minimum necessary quantity of the resist liquid, which in turn reduces consumption of the resist liquid.

<Modification>

Figure 12:
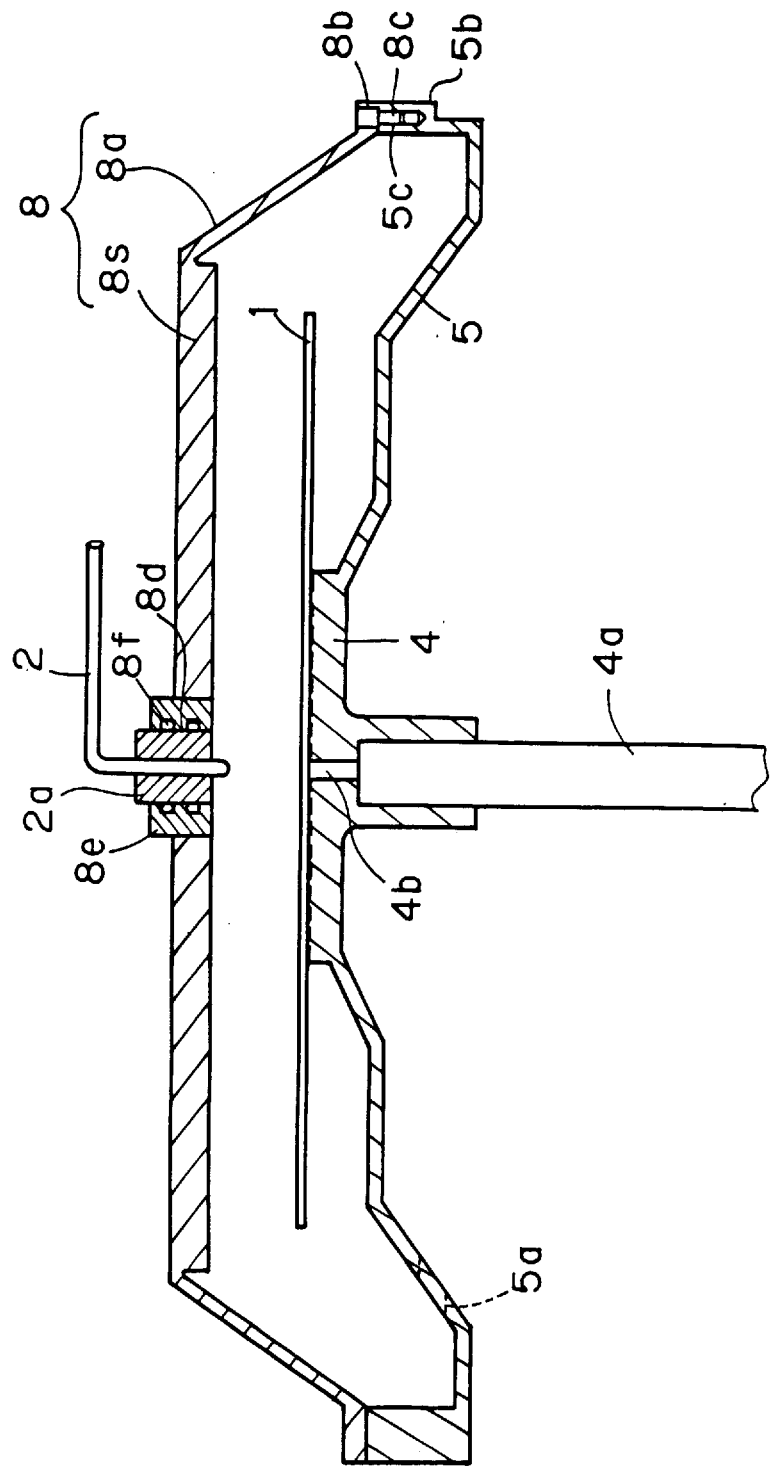
FIG. 12 is a cross sectional view showing an outline of a spin coating apparatus which is modified according to the present invention.

(1) FIG. 12 shows a modified version the spin coating apparatus according to the preferred embodiment above. In FIG. 12, denoted at 4 is a supporting pedestal which fixes the central portion of the wafer by suction force. The supporting pedestal 4 is fixedly mounted by a fixing pin or the like not shown to an upper end of the rotation shaft 4a which is driven under the control of a motor not shown (i.e., supporting means: substrate holding chuck). A suction hole 4b is formed in a central portion of the supporting pedestal 4 to suck the wafer 1. Denoted at 5 is a drain chamber which includes a drain hole 5a. Formed integrally with the supporting pedestal 4, the chamber 5 rotates with the rotation shaft 4a and the supporting pedestal 4.

Further, above the chamber 5, a rotation plate 8 which is formed approximately in the shape of cone is disposed integrally with the chamber 5, which whirls air within the chamber 5 so that the wafer 1 is prevented from cutting wind at its surface. A movement mechanism not shown ensures that the rotation plate 8 is freely movable close to and away from the supporting pedestal 4. When the wafer 1 rotates (including the resist liquid discharging step), a disk portion 8s which serves as a top surface wall of the rotation plate 8 is located in the vicinity of and above the supporting pedestal 4 so as to be parallel with the wafer 1. A distance between an inner wall surface of the disk portion 8s and the wafer 1 is preferably three to twenty mm. For instance, the distance is five mm. The diameter of the disk portion 8s is set larger than the diameter of the wafer 1 so that the rotation plate 8 extends above the entire wafer 1. For example, the diameter of the disk portion 8s is set about 10% larger than the diameter of the wafer 1. As shown in FIG. 12, a flange portion 8b which is received by a top end of a side wall 5b of the chamber 5 is formed in a bottom end portion of a slanted wall portion 8a which serves as a peripheral slanted wall of the rotation plate 8. Pins 8c (rotation plate fixing member) are fixed to the flange portion 8b to protrude downwardly at a plurality of positions. The pins 8c are formed to prevent the chamber 5 and the rotation plate 8 from getting displaced from each other when the wafer is rotated. The pins 8c are loosely engaged with pin holes 5c which are formed in the top end of the side wall 5b of the chamber 5 so as to be freely detachable. Further, a through hole 8d is formed in a central portion of the disk portion 8s, and the nozzle 2 penetrates through the through hole 8d. A spacer 8e which is formed approximately in the shape of cylinder is fixed in the through hole 8d. On the other hand, a bush 2a is attached in the vicinity of a tip portion of the nozzle 2. The bush 2a is loosely received by a hollow portion of the spacer 8e, and sealed with a magnetic fluid seal 8f. This makes a space which is enclosed by the supporting pedestal 4, the chamber 5 and the rotation plate 8 hermetically sealed except at a discharging hole of the nozzle 2, the suction hole 4b of the supporting pedestal 4 and the drain hole 5a. The rotation plate 8 is spaced away from the supporting pedestal 4 and the chamber 5 so that the supporting pedestal 4 is opened at a top portion when the wafer 1 is mounted or removed.

In such a spin coating apparatus, when the supporting pedestal 4 is rotated, the rotation plate 8 which is fixed by the pins 8c is rotated together with the wafer 1. Since this whirls air which is contained in a space between the rotation plate 8 and the wafer 1, thereby causing the air to move as a so-called rigid body, the wafer 1 is prevented from cutting wind and evaporation of the solvent which is contained in the resist liquid is suppressed. In addition, since the rotation plate 8 and the supporting pedestal 4 form an almost hermetically sealed space, even if the solvent which is contained in the resist liquid evaporates, the air is saturated soon and further evaporation of the solvent is suppressed. Therefore, the resist liquid spreads smoothly, whereby the processing time is further shortened.

(2) In the modification shown in FIG. 12, the rotation plate 8 is located closely above the supporting pedestal 4 over the entire period of rotation of the wafer 1. However, the rotation plate 8 may be located closely above the supporting pedestal 4 only during the discharging time t in which the resist liquid is discharged from the nozzle 2.

(3) In the modification shown in FIG. 12, the space which is enclosed by the supporting pedestal 4, the chamber 5 and the rotation plate 8 is hermetically sealed except at the discharging hole of the nozzle 2, the suction hole 4b of the supporting pedestal 4 and the drain hole 5a. However, the space may not be completely hermetically sealed. For instance, reduction in the quantity of evaporation of the solvent is reduced in a structure in which the rotation plate 8 is located above a substrate with an area surrounding the substrate which is supported on the supporting pedestal 4 open.

While the invention has been described in detail, the foregoing description is in all aspects illustrative and not restrictive. It is understood that numerous other modifications and variations can be devised without departing from the scope of the invention.

We claim:

1. A spin coating apparatus, comprising:

rotation supporting means which rotates about a vertical shaft while supporting a substrate;

coating liquid discharging means which includes a discharge hole of a predetermined radius, said coating liquid discharging means discharging coating liquid from a fixed position onto a central portion of said substrate which is rotated;

coating liquid supplying means for supplying said coating liquid to said coating liquid discharging means;

coating liquid stopping means for stopping supply of said coating liquid to said coating liquid discharging means;

discharging time calculating means for calculating a proper coating liquid discharging time, based on a rotation angular speed of said rotation supporting means and a discharged flow quantity discharged from said coating liquid discharging means per unit time;

stop controlling means for enabling said coating liquid stopping means to stop said supply of said coating liquid after said proper coating liquid discharging time has elapsed since said coating liquid supply means started supplying said coating liquid;

a rotation plate which is located closely above and parallel to said substrate at least during said proper coating liquid discharging time t, said rotation plate having a diameter which is larger than that of said substrate; and a rotation plate fixing member for supporting said rotation plate so that said rotation plate rotates together with said rotation supporting means.

2. A spin coating apparatus, comprising:

rotation supporting means which rotates about a vertical shaft while supporting a substrate;

coating liquid discharging means which includes a discharging hole of a predetermined radius, said coating liquid discharging means discharging coating liquid from a fixed position onto a central portion of said substrate which is rotated;

coating liquid supplying means for supplying said coating liquid to said coating liquid discharging means;

coating liquid stopping means for stopping supply of said coating liquid to said coating liquid discharging means;

angular speed switching means tar switching a rotation angular speed of said rotation supporting means from a first rotation angular speed for discharging of said coating liquid to a second rotation angular speed for levelling of said coating liquid after said coating liquid is discharged;

discharging time calculating means for calculating a proper coating liquid discharging time, based on said first rotation angular speed, said second rotation angular speed, and a discharged flow quantity discharged from said coating liquid discharging means per unit time; and stop controlling means for driving said coating liquid stopping means after said proper coating liquid discharging time has elapsed since said coating liquid supplying means started supplying said coating liquid;

said discharging time calculating means including:
rotation angular speed comparing means for comparing said first rotation angular speed with said second rotation angular speed;
a first calculation means for calculating said proper coating liquid discharging time, using a first arithmetic expression for calculating a time which is necessary for said coating liquid to outwardly flow and reach an edge of said substrate because of rotational centrifugal force which is created by rotation at said first rotation angular speed, when said rotation angular speed comparing means determines that said first rotation angular speed is faster than said second rotation angular speed; and
a second calculation means for calculating said proper coating liquid discharging time, using a second arithmetic expression for calculating a time which is necessary for said coating liquid to outwardly flow and reach an intermediate position of said substrate, which is defined at a predetermined radius on said substrate, because of rotational centrifugal force which is created by rotation at said second rotation angular speed, when said rotation angular speed comparing means determines that said first rotation angular speed is slower than said second rotation angular speed.

3. The spin coating apparatus of claim 2, wherein said first arithmetic expression for yielding said proper coating liquid discharging time t is as follows:

$$t \leq \frac{\alpha_1}{\omega^2} \left\{ \left( 1 + \frac{\alpha_2 \omega^2 (r^2 - r_0^2)}{Q} \right)^{2/3} - 1 \right\} \quad (1)$$

where the symbol $r_0$ expresses a radius of said discharging hole of said coating liquid supplying means, the symbol $\omega$ expresses said first rotation angular speed, the symbol $\omega_0$ expresses said second rotation angular speed, the symbol r expresses a radius of said substrate, the symbol Q expresses said discharged flow quantity of said coating liquid which is discharged from said coating liquid discharging means per unit time, and the symbols $\alpha_1$ and $\alpha_2$ express predetermined coefficients.

4. The spin coating apparatus of claim 2, wherein said first arithmetic expression for yielding said proper coating liquid discharging time t is as follows:

$$t \leq \frac{\alpha_{S1} \nu}{0.395 \, \delta_0^2 \omega^2} \left\{ \left( 1 + \frac{1.185 \pi \, \delta_0^3 \omega^2 (r^2 - r_0^2)}{2 \nu Q} \right)^{2/3} - 1 \right\} \quad (2)$$

where the symbol $r_0$ expresses a radius of said discharging hole of said coating liquid supplying means, the symbol $\omega$ expresses said first rotation angular speed, the symbol $\omega_0$ expresses said second rotation angular speed, the symbol r expresses a radius of said substrate, the symbol Q expresses said discharged flow quantity of said coating liquid which is discharged from said coating liquid discharging means per unit time, the symbol $\delta_0$ expresses a height of said discharging hole measured from a top surface of said substrate, the symbol $\nu$ expresses a coefficient of kinematic viscosity of said coating liquid, and the symbol $\alpha_{S1}$ expresses a predetermined safety coefficient.

5. The spin coating apparatus of claim 2, wherein said second arithmetic expression for yielding said proper coating liquid discharging time t is as follows:

$$t \leq \frac{\alpha_1}{\omega^2} \left[ \left\{ 1 + \frac{\alpha_2 \omega^2 \left( r^2 \left( \frac{(\alpha_{S2} - 1)\omega + \omega_0}{\alpha_{S2} \omega_0} \right)^2 - r_0^2 \right)}{Q} \right\}^{2/3} - 1 \right] \quad (3)$$

where the symbol $r_0$ expresses a radius of said discharging hole of said coating liquid supplying means, the symbol $\omega$ expresses said first rotation angular speed, the symbol $\omega_0$ expresses said second rotation angular speed, the symbol r expresses a radius of said substrate, the symbol Q expresses said discharged flow quantity of said coating liquid which is discharged from said coating liquid discharging means per unit time, and the symbols $\alpha_1$, $\alpha_2$ and $\alpha_{S2}$ express predetermined coefficients.

6. The spin coating apparatus of claim 2, wherein said second arithmetic expression for yielding said proper coating liquid discharging time t is as follows:

$$t \leq \frac{\alpha_{S1} \nu}{0.395 \delta_0^2 \omega^2} \left[ \left\{ 1 + \frac{1.185 \pi \delta_0^3 \omega^2 \left( r^2 \left( \frac{(\alpha_{S2} - 1)\omega + \omega_0}{\alpha_{S2} \omega_0} \right)^2 - r_0^2 \right)}{2 \nu Q} \right\}^{2/3} - 1 \right] \quad (4)$$

where the symbol $r_0$ expresses a radius of said discharging hole of said coating liquid supplying means, the symbol $\omega$ expresses said first rotation angular speed, the symbol $\omega_0$ expresses said second rotation angular speed, the symbol r expresses a radius of said substrate, the symbol Q expresses said discharged flow quantity of said coating liquid which is discharged from said coating liquid discharging means per unit time, the symbol $\delta_0$ expresses a height of said discharging hole measured from a top surface of said substrate, the symbol $\nu$ expresses a coefficient of kinematic viscosity of said coating liquid, and the symbols $\alpha_{S1}$ and $\alpha_{S2}$ express predetermined coefficients.

7. The spin coating apparatus of claim 2, wherein said first rotation angular speed is set in a range from 2,000 r.p.m. to 6,000 r.p.m..

* * * * *